United States Patent [19]

Clark

[11] 3,964,001
[45] June 15, 1976

[54] ANTI BACKLASH AND TREADLE BAR LINKAGE SYSTEM

[75] Inventor: Alfred James Clark, Palatine, Ill.

[73] Assignee: Motorola, Inc., Schaumburg, Ill.

[22] Filed: May 2, 1975

[21] Appl. No.: 574,064

[52] U.S. Cl. .................................. 334/7; 74/10.33; 74/409
[51] Int. Cl.² .......................................... H03J 5/32
[58] Field of Search ............ 333/7; 74/10.27, 10.33, 74/409

[56] References Cited
UNITED STATES PATENTS

| | | | |
|---|---|---|---|
| 2,397,777 | 4/1946 | Colman | 74/409 |
| 3,635,097 | 1/1972 | Mears, Jr. | 74/10.33 |

*Primary Examiner*—Paul L. Gensler
*Attorney, Agent, or Firm*—Margaret M. Parker; James W. Gillman

[57] ABSTRACT

In a pushbutton type tuner assembly for a radio receiver the treadle bar drive gear, which is coupled to the manual tuning knob through the crown gear and the clutch mechanism, is biased into meshed relation with the treadle bar gear through a pair of lever arms mounted for pivotable movement about fixed pins, and a pair of springs. With the end of the treadle bar gear shaft supported in an aperture in the side wall of the tuner, the first lever arm applies a moment to the treadle bar shaft through the bias of a spring secured to the front wall of the tuner, thereby holding that shaft tightly against the supporting aperture wall. The second lever arm applies a moment to the pinion gear shaft through the bias of the second spring which couples the two lever arms together and adds to the moment of the first spring. The two moments provide balanced radial forces on the gears which eliminate backlash and maintain the two gears in a properly meshed relation.

9 Claims, 4 Drawing Figures

ANTI BACKLASH AND TREADLE BAR LINKAGE SYSTEM

BACKGROUND OF THE INVENTION

1. Field of the Invention

This invention relates to pushbutton type tuners for radio receivers and more directly to means of improving the interaction of the gears in the tuning assembly and simplifying the installation of the treadle bar mechanism in the tuner.

2. Prior Art

The treadle bar drive gear and the treadle bar gear of pushbutton type tuners are conventionally biased into a meshed position by some form of linkage. Previous linkage mechanisms have been subject to backlash problems combined with gear slippage. Attempts to solve these twin problems have typically used a fixed lug or pin near the end of each of two lever arms as pivot points and a biasing spring connecting the opposite ends of the two lever arms to cause the lever arms to apply pressure on the mounting shafts of the two gears. These attempts have proven inadequate for satisfactory alignment of the treadle bar drive gear and treadle bar gear without an assembly line adjustment which required an adjustment pivot screw and lock nut. Even with a factory adjustment, the gears did not necessarily stay aligned because of the "scissors" type action of the linkages. The backlash problem still remained to be solved.

SUMMARY OF THE INVENTION

Therefore, it is a general object of this invention to provide an improved linkage for the drive gears of a push-button tuner assembly.

It is a more specific object to provide accurate meshing between the treadle bar drive gear and the gear portion of the treadle bar mechanism.

It is another specific object to eliminate backlash in the operation of the aforementioned gears by better control of the gear loading.

It is a particular object to eliminate any need for an assembly line adjustment of the relative positioning and loading of the gears, thus eliminating the components needed for that adjustment.

The objectives stated above are achieved in the present invention by biasing the several working parts of the tuner drive assembly into position with increased and balanced forces. This is done by having a supportive structure, a plurality of tuning coils, a plurality of tuning cores, each one of the cores being movable longitudinally within one of the coils, a reciprocatingly movable carriage for holding the cores, and tuning means for predetermining specific positions of the cores within the coils for automatically selecting one of the predetermined positions of the cores and for manually selecting any desired position of the cores. The tuning means includes a gear supporting shaft, a first gear means mounted on the supporting shaft, manually operable means for rotating the gear supporting shaft, actuating means rotatably mounted on the supportive structure for moving the carriage, second gear means integral with the actuating means and positioned to coact with the first gear means, first lever means pivotably mounted on the supportive structure and positioned to apply a moment to the first gear supporting shaft, second lever means pivotably mounted on the supportive structure and positioned to apply a moment to the supporting shaft of the actuating means, thereby causing the first gear to mesh with the second gear. The assembly also includes a first spring means for biasing the first lever means toward the second lever means, and a second spring means connected to the second lever means for biasing the second lever means toward the first lever means.

DETAILED DESCRIPTION OF A PREFERRED EMBODIMENT

Figure 1:
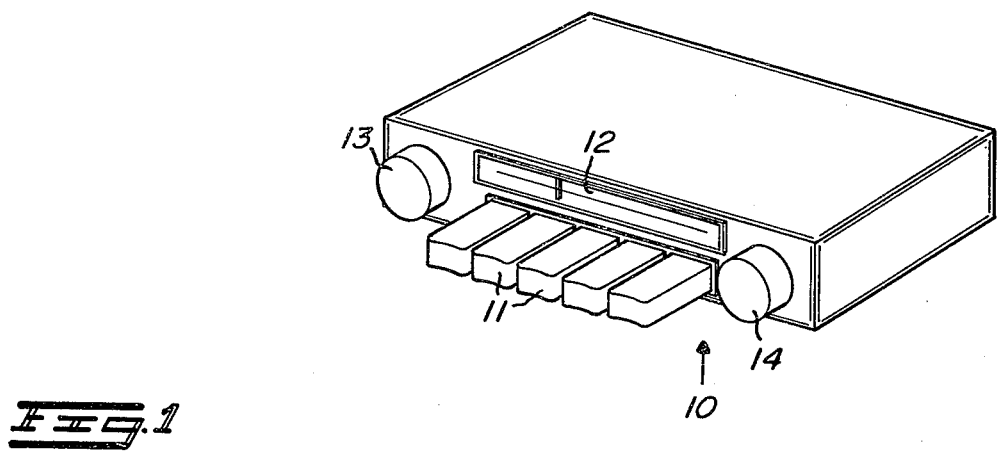
FIG. 1 is a perspective view of a typical pushbutton radio tuner such as might utilize the invention.

Referring now to the drawing wherein like members have been employed throughout the views to designate similar components, there is illustrated in FIG. 1 a typical radio tuner 10 of the type utilizing the invention and having pushbuttons 11, a dial scale 12, an on-off-volume control knob 13 and a manual tuning control knob 14.

Figure 2:
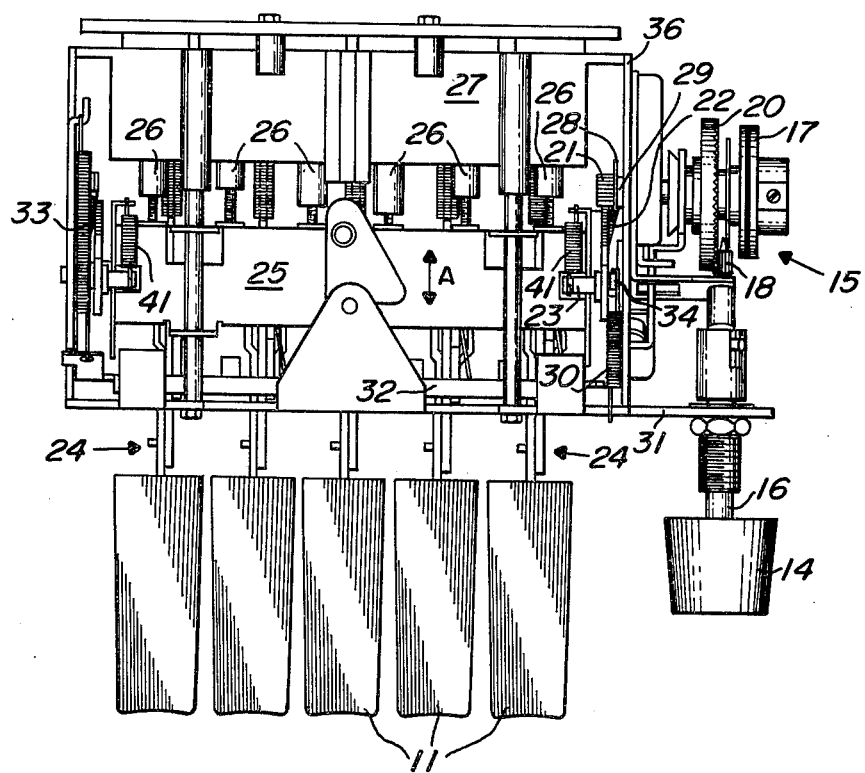
FIG. 2 is a top view of a portion of the tuner of FIG. 1.
Figure 3:
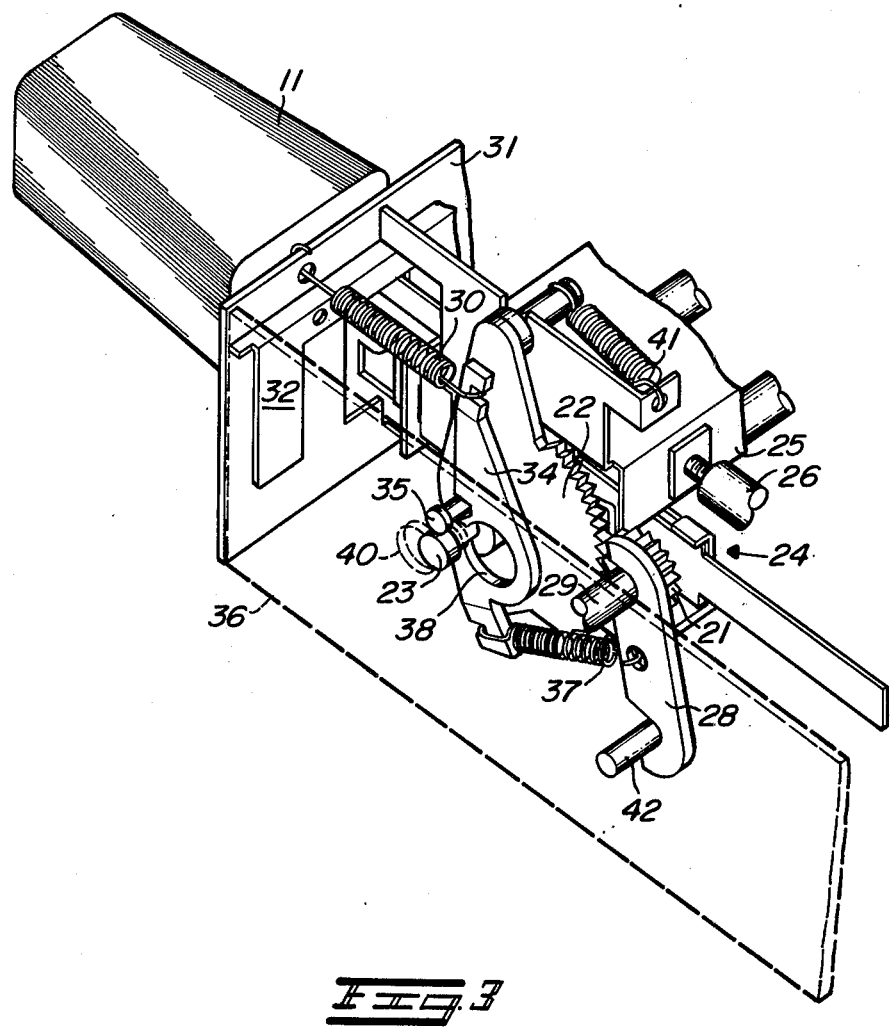
FIG. 3 is a perspective view of a preferred embodiment of a portion of the tuner assembly according to the invention.

FIGS. 2 and 3 show a manual tuning assembly 15 which includes the knob 14 mounted on a shaft 16, a clutch mechanism 17, a pinion gear 18, a crown gear 20, a drive pinion gear 21 and a treadle bar gear 22. The treadle bar gear and a treadle bar shaft 23 are parts of the treadle bar mechanism (partially shown) which cooperates with either the manual tuning assembly 15 or with a pushbutton mechanism 24 to slideably move a core carriage 25 fore and aft (see arrow A on the carriage in FIG. 2) on a pair of guide rods for setting the position of a plurality of cores 26 within a like number of coils (not shown) contained in a housing 27. The assembly and movement of a core carriage are well known in the art. One end of a lever arm 28 bears against a drive pinion gear shaft 29, the shaft being connected to and driven by crown gear 20 when the clutch 27 is engaged. The other end of lever arm 28 is pivoted about a pin 42 fixedly mounted on and projecting inwardly from the side support plate 36 as is further described below. A spring 30 is fastened at one end to a front support plate 31. In an alternate embodiment the spring 30 could be fastened to the declutch bar 32 where it would also perform the function of the declutch return spring 33.

As is well known in the art, pushbuttons 11 operate the declutch mechanism through the declutch bar 32 to disengage the crown gear 20 from the pinion drive gear 21 when one of the pushbuttons is actuated to recall or preset a frequency. Upon release of the pushbutton, the declutch return spring 33 re-engages the clutch mechanism.

Figure 4:
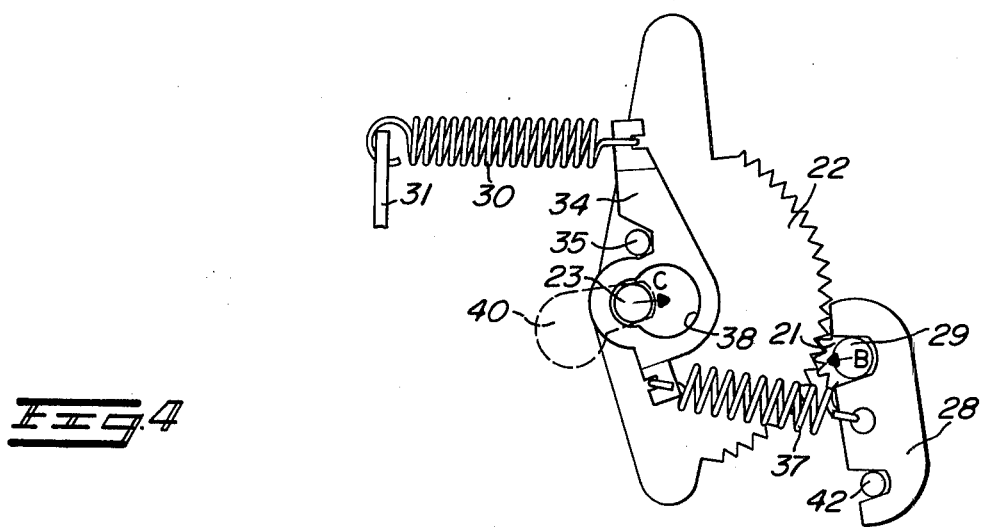
FIG. 4 is a plan view in partial section of the lever arms and springs of the present invention.

As shown more clearly in FIGS. 3 and 4, the second end of spring 30 is connected to one end of a second lever arm 34 which pivots about a pin 35, the latter being fixedly mounted on and projecting inwardly from a side support plate 36 (shown dotted in on FIG. 3). The other end of the second lever arm 34 is connected to and biases the first lever arm 28 toward the treadle bar gear 22 (see arrow B FIG. 4) by means of a spring 37. The treadle bar shaft 23 extends through an aperture 38 in the lever arm 34 and is biased by the wall of the aperture 38 against the wall of a mounting aperture 40 in the side wall 36. That is, the action of the springs 30, 37 applies a counterclockwise moment to lever arm 34 about pin 35 causing the wall of the hole 38 to drive shaft 23 rightward (see arrow C in FIG. 4) against the wall of a hole 40, thereby tightly holding shaft 23 and the treadle bar gear 22 in a fixed pivotable mounting.

The structure described above functions as follows: the two lever arms 28, 34, the two springs 30, 37 and the pivot pins 35, 42 combine to provide a balanced structure for loading the shaft of the drive pinion gear 21 and the treadle bar gear 22. That is, shaft 23 is pushed counterclockwise about pin 35 while shaft 29 is pushed counterclockwise about pin 42. This improved structure keeps the gears 21, 22 in a properly aligned and meshed relationship and, since it is balanced, increased pressure can be applied. Backlash in the two gears is essentially eliminated thereby. In addition, there is provided extra loading of the treadle bar shaft 23 into the slot or aperture 40 by both springs 30, 37, which helps to maintain the shaft in its proper position even when acted upon by the very considerable forces involved in actuation of the pushbutton mechanism 24.

What is claimed is:

1. A pushbutton type tuner assembly for a radio receiver, the assembly having a supportive structure, a plurality of tuning coils, a plurality of tuning cores, each one of the cores being movable longitudinally within one of the coils, a reciprocatingly movable carriage for holding the cores, and tuning means for predetermining specific positions of the cores within the coils for automatically selecting one of the predetermined positions of the cores and for manually selecting any desired position of the cores, the tuning means comprising:

a gear supporting shaft rotatably mounted on the supportive structure;
   first gear means fixedly mounted on the supporting shaft;
   manually operable means for rotating the gear supporting shaft;
   actuating means rotatably mounted on the supportive structure for moving the core carriage;
   second gear means integral with the actuating means and positioned to coact with the first gear means;
   first lever means pivotably mounted on the supportive structure and positioned to apply a moment to the gear supporting shaft;
   second lever means pivotably mounted on the supportive structure and positioned to apply a moment to the supporting shaft of the actuating means, thereby causing the first gear to mesh with the second gear;
   first spring means for biasing the first lever means toward the second lever means;
   second spring means connected to the second lever means for biasing the second lever means toward the first lever means.

2. A pushbutton type tuner assembly according to claim 1 wherein the first spring means is secured at one end to the first lever means and at a second end to the second lever means and applies a moment to the second lever means which is additive to the moment applied to the second lever means by the second spring means.

3. A pushbutton type tuner assembly for a radio receiver, the assembly having a supportive structure, a plurality of tuning coils, a plurality of tuning cores, each one of the cores being movable longitudinally within one of the coils, a reciprocatingly movable carriage for holding the cores, tuning means for predetermining specific positions of the cores within the coils for automatically selecting one of the predetermined positions of the cores and for manually selecting any desired position of the cores, the tuning means comprising:

a gear supporting shaft rotatably mounted on the supportive structure;
   first gear means fixedly mounted on the supporting shaft;
   manually operable means for rotating the gear supporting shaft;
   actuating means rotatably mounted on the supportive structure for moving the core carriage;
   second gear means integral with the actuating means and positioned to coact with the first gear means;
   linking means for maintaining the first and second gear means in a meshed relationship and for preventing backlash between the gear means, the linking means including
   a first spring means;
   first lever means pivotably mounted adjacent one end on the supportive structure and loaded by the first spring means to cause the first lever means to exert force on the gear supporting shaft;
   second spring means anchored at a first end;
   second lever means mounted to pivot about a portion of the supporting structure, the second lever means having one end spring-loaded by the first spring means and having a second end spring-loaded by a second end of the second spring means, causing the second lever means to exert pressure on the actuating means against the supportive structure.

4. A tuner assembly according to claim 3 further including declutch means mounted for movement between an activated and an at-rest position and wherein the second spring means is mounted for biasing the declutch means toward the at-rest position.

5. A tuner assembly according to claim 3 wherein the actuating means is supported on a shaft and the forces applied to the actuating means by the first and second springs are applied to the supporting shaft thereof and are additive.

6. A tuner assembly according to claim 3 wherein the first end of the second spring means is attached to the supportive structure.

7. A tuner assembly according to claim 6 and further including third spring means linking the declutch means to the carriage for returning the declutch means to the at-rest position.

8. A tuner assembly according to claim 3 wherein the actuating means is rotatably and slideably mounted on the supportive structure and the second lever member is adapted to receive a portion of the actuating means for biasing the latter against a portion of the supportive structure.

9. A tuner assembly according to claim 8 wherein the actuating means is supported on a shaft, with one end of the shaft received in a first aperture of the support structure, the receiving portion of the second lever being an aperture in the second lever to which the actuating means shaft extends, the portion of the supportive structure against which the shaft of the actuating means is biased being the wall of the first aperture supporting the shaft.

* * * * *